United States Patent
Frischknecht

(10) Patent No.: US 6,977,391 B2
(45) Date of Patent: Dec. 20, 2005

(54) TRANSPORT BALANCING DIFFUSION LAYER FOR RATE LIMITED SCAVENGING SYSTEMS

(75) Inventor: Kyle D. Frischknecht, Livermore, CA (US)

(73) Assignee: Osram Semiconductors GmbH, Regensburg (DE)

(*) Notice: Subject to any disclaimer, the term of this patent is extended or adjusted under 35 U.S.C. 154(b) by 59 days.

(21) Appl. No.: 10/672,546

(22) Filed: Sep. 25, 2003

(65) Prior Publication Data

US 2005/0067718 A1    Mar. 31, 2005

(51) Int. Cl.[7] ............................................. H01L 35/24
(52) U.S. Cl. ........................................ 257/40; 257/787
(58) Field of Search ........................................ 257/787

(56) References Cited

U.S. PATENT DOCUMENTS

| | | | |
|---|---|---|---|
| 5,920,080 A | * | 7/1999 | Jones ............................ 257/40 |
| 6,069,443 A | * | 5/2000 | Jones et al. .................. 313/504 |
| 6,465,953 B1 | * | 10/2002 | Duggal ......................... 313/553 |
| 6,765,351 B2 | * | 7/2004 | Forrest et al. ................ 313/506 |
| 6,835,950 B2 | * | 12/2004 | Brown et al. .................. 257/40 |

* cited by examiner

*Primary Examiner*—Thao P. Le
(74) *Attorney, Agent, or Firm*—Thomas George

(57) ABSTRACT

An embodiment of an encapsulated organic optoelectronic device is described. The encapsulated device includes an organic optoelectronic device on a substrate and that organic optoelectronic device has a cathode. The encapsulated device further includes a diffusion layer that is on the organic optoelectronic device and that diffusion layer covers exposed areas of the organic optoelectronic device. An adhesive layer is on the substrate and is around a perimeter of the diffusion layer. An encapsulation lid is on the adhesive layer, and a getter is on the encapsulation lid such that the getter overlies the organic optoelectronic device. The diffusion layer slows a rate of absorption of reactive gasses by the cathode and increases a proportion of the reactive gasses absorbed by the getter relative to the cathode.

10 Claims, 3 Drawing Sheets

TRANSPORT BALANCING DIFFUSION LAYER FOR RATE LIMITED SCAVENGING SYSTEMS

BACKGROUND OF THE INVENTION

An organic optoelectronic device is, for example, an organic light emitting diode ("OLED") display, an OLED light source used for general purpose lighting, an organic light sensor array, an organic solar cell array, or an organic laser. The OLED display can be, for example, a passive matrix display, an alpha-numeric OLED display, or an active matrix OLED display. In the specific case of the OLED display, the display is typically comprised of an anode layer and a cathode layer where the anode layer is typically patterned to form multiple anode strips and cathode layer is patterned to form multiple cathode strips. The anode strips intersect the cathode strips, and pixels are formed at the intersections of the anode strips and the cathode strips by sandwiching one or more organic layers between the anode strips and the cathode strips.

The organic optoelectronic device requires protection from reactive gasses such as oxygen and moisture in the atmosphere, and therefore employ some form of encapsulation. One common procedure to encapsulate the organic electronic device is to sandwich it between a substrate and an encapsulation lid, and a continuous adhesive layer around the perimeter of the device bonds together the substrate and the encapsulation lid such that the device is sealed. The adhesive layer is typically not impermeable to oxygen and particularly not to moisture, so the encapsulated device package will generally have some finite permeation rate. These reactive gases that permeate through the adhesive layer react with the cathode layer and prevent electron injection at the sites of reaction. The reactive gasses that permeate through the adhesive seal react with the cathode layer at, for example, pinholes in the cathode layer or at the edges of the cathode strips. Eventually, the sites of reaction reach some specified quantity, and the device is considered no longer useable.

For a fixed permeation rate into the encapsulated device package, employing getters inside the package can extend the useable lifetime of the device. These getters absorb some portion of the reactive gases that would otherwise react with the cathode layer. When getters are employed, the overall package can be visualized as two scavenging systems operating in parallel, one being the cathode layer and the other being the getter. While getters absorb some portion of the reactive gasses that permeate through the adhesive seal, a significant portion of the reactive gasses still reach the cathode layer of the OLED display thus prematurely making the device no longer usable prior to the getter reaching its capacity limit.

The academic solution to the permeation problem is to use an extremely fast getter or employ a completely impermeable hermetic seal—a true barrier for the cathode layer. These solutions, although desirable, are not easily attainable or easily implementable given current techniques and materials. The deposition of a thin-film barrier layer without pinholes cannot be easily achieved. Even for the case of a fast getter, there can be complications implementing it in a manufacturing environment. Also, the device's design specification may require a relatively slow getter (this requirement may be due in part to getter availability or cost), thus an extremely fast getter may not be available.

An aluminum capping layer is typically deposited onto the cathode strips for protection; however, the capping layer only protects the top of the cathode strips, but not the edges of the strips. The reactive gasses can attack the edges of the cathode strips causing detrimental effects such as pixel shrinkage. The pixel shrinkage occurs when the reactive gasses that permeate through the adhesive layer react with the edges of the cathode strips and the areas that react with the gasses no longer inject electrons resulting in no emission of light from these areas.

For the foregoing reasons, there exists a need to encapsulate the organic optoelectronic device that is easily implementable, and is effective at increasing device lifetime by, for example, protecting the edges of the cathode layer and increasing the proportion of reactive gasses absorbed by the getter.

SUMMARY

An embodiment of an encapsulated organic optoelectronic device is described. The encapsulated device includes a substrate and an organic optoelectronic device is on the substrate and this optoelectronic device has a cathode. In addition, the encapsulated device includes a diffusion layer that is on the organic optoelectronic device; the diffusion layer covers exposed areas of the organic optoelectronic device. The encapsulated device also includes an adhesive layer that is on the substrate and around a perimeter of the diffusion layer. The encapsulated device further includes an encapsulation lid that is on the adhesive layer, and a getter is on the encapsulation lid. The getter overlies the organic optoelectronic device. The diffusion layer slows a rate of absorption of reactive gasses by the cathode and increases a proportion of the reactive gasses absorbed by the getter relative to the cathode.

An embodiment of a method to encapsulate an organic optoelectronic device is described. This method includes fabricating the organic optoelectronic device on a substrate where the organic optoelectronic device has a cathode. The method also includes depositing a diffusion layer on the organic optoelectronic device such that the diffusion layer covers exposed areas of the organic optoelectronic device. The method further includes depositing an adhesive layer on an encapsulation lid, or on the substrate around a perimeter of the diffusion layer such that when the adhesive layer, the encapsulation lid, and the substrate are brought together, the organic optoelectronic device is sealed. In addition, the method includes attaching a getter to the encapsulation lid such that when the adhesive layer, the encapsulation lid, and the substrate are brought together, the getter overlies the organic optoelectronic device.

DETAILED DESCRIPTION

Figure 1:
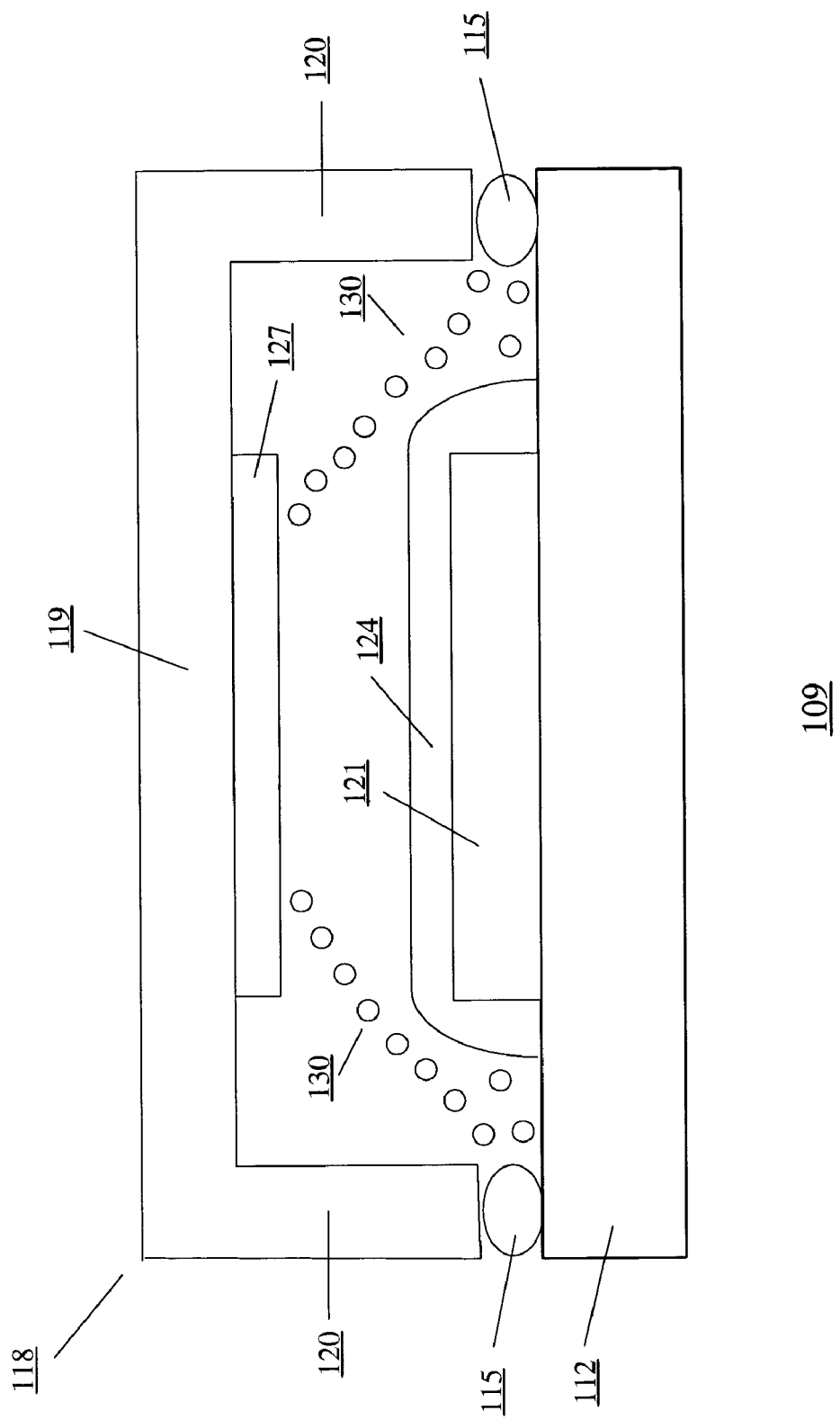
FIG. 1 shows a cross-section of an embodiment of an encapsulated organic optoelectronic device according to the present invention.

FIG. 1 shows a cross-section of an embodiment of an encapsulated organic optoelectronic device package 109 according to the present invention. In FIG. 1, an organic optoelectronic device such as, for example, an OLED display 121 is fabricated on a substrate 112. As used within the specification and the claims, the term "on" includes when layers are in physical contact and when layers are separated by one or more intervening layers. The organic optoelectronic device can be a device other than the OLED display 121 such as, for example, an OLED light source used for general purpose lighting, an organic light sensor array, an organic solar cell array, or an organic laser. In the specific case of the OLED display 121, the display is typically comprised of an anode layer and a cathode layer where the anode layer is typically patterned to form multiple anode strips and the cathode layer is patterned to form multiple cathode strips. The anode strips intersect the cathode strips, and pixels are formed at the intersections of the anode strips and the cathode strips by sandwiching one or more organic layers between the anode strips and the cathode strips.

A diffusion layer 124 is deposited on the OLED display 121. The diffusion layer 124 is deposited so as to cover exposed areas of the OLED display 121. The exposed areas include the top and sides of the OLED display 121 including the top and sides of the cathode strips. Some of the reactive gasses 130 that permeate through the adhesive layer 115 diffuse through the diffusion layer 124 to eventually reach the cathode layer. The diffusion layer 124 slows the transport of the reactive gasses 130 to the cathode layer of the OLED display 121. The diffusion layer 124 is comprised of a material that does not chemically react with the cathode layer (i.e., is solvent-free), and has a low shrinkage characteristic so that unreasonable force is not applied to the device upon curing. Preferably, the diffusion layer 124 is comprised of a solvent-free organic polymer layer. More preferably, the diffusion layer 124 is comprised of solvent-free UV-curable acrylate materials, UV-curable or thermally-curable epoxies that do not chemically react with the cathode layer, or photoresists that do not chemically react with the cathode layer. Most preferably, the diffusion layer 124 is comprised of a solvent-free UV-curable acrylate material or combinations of acrylates. The range of thickness of the diffusion layer 124 is typically from about one micron to about one hundred microns; preferably, is from about five microns to about twenty microns; and more preferably, is about twenty microns. By using the diffusion layer 124, the lifetime of the OLED display 121 can be improved without having to deposit a barrier layer on the device to improve lifetime. It is much easier to deposit the diffusion layer 124 without pinholes and implement in a manufacturing process than to deposit a barrier layer without pinholes.

An adhesive layer 115 is deposited on an encapsulation lid 118, or on a substrate 112 around a perimeter of the diffusion layer 124. The adhesive layer 115 bonds with the encapsulation lid 118 and the substrate 112, and is deposited such that when the encapsulation lid 118, the adhesive layer 115, and the substrate 112 are brought together, the OLED display 121 is sealed. The adhesive layer 115 is comprised of a curable adhesive, preferably, a UV-curable or thermal curable epoxy. The range of thickness of the adhesive layer 115 is typically from about five microns to about ten microns.

The encapsulation lid 118 is comprised of an opaque or a nonopaque material. Preferably, the encapsulation lid 118 is comprised of metal, glass, or alternatively plastic with a barrier layer on the plastic. The encapsulation lid 118 may include a top end 119 and a side 120 that protrudes from the edges of the top end 119; alternatively, the encapsulation lid 118 can be a flat plate of glass, metal, or plastic with a barrier layer. The top end 119 includes an exterior side and an interior side. The interior side faces the OLED display 121.

A getter 127 is attached to the interior side of the encapsulation lid 118 and overlies the OLED display 121. The getter 127 absorbs some portion of the reactive gasses 130 that permeate through the adhesive layer 115. Preferably, the getter has a fast rate of absorption. However, in some cases, the design may specify a getter with a relatively slow rate of absorption due to, for example, cost or getter availability. By depositing the diffusion layer 124 on the OLED display 121, the rate of absorption of reactive gasses 130 by the cathode layer is reduced while the proportion of the reactive gasses 130 absorbed by the getter 127 relative to the cathode layer is increased. Employing the diffusion layer 124 is especially beneficial when the rate of absorption of the getter is relatively slow.

Reactive gasses 130 permeate through the adhesive layer 115 and are, for the most part, absorbed either by the getter 127, or the cathode layer via the diffusion layer 124. The reactive gasses 130 that diffuse through the diffusion layer 124 eventually reach the cathode layer of the OLED display 121 but at a slower rate than if the diffusion layer 124 was not present.

The encapsulated device package is a dynamic system that includes: (a) the reactive gasses 130 that permeate through the adhesive layer 115, and (b) two scavenging systems—the getter 127 and the diffusion layer 124. For the getter 127, there are two limiting characteristics. The first limitation is the total capacity of reactive gas that the getter 127 can absorb. Because the encapsulated device package has a fixed and finite volume and the getter is placed inside the package, the getter 127 itself is limited in size (mass and volume). As a result, the getter 127 will have an ultimate absorption limit. The second limiting characteristic is the rate at which the getter 127 can absorb the reactive gases.

As shown in Example 1 below, the proportion of reactive gasses 130 absorbed by one scavenging system relative to the other scavenging system is proportional to the rate at which the reactive gasses are absorbed by each of the scavenging systems. Specifically, as shown in Example 1 below, by decreasing the rate at which the getter absorbs the reactive gasses, the proportion of reactive gasses absorbed by the cathode layer is increased. Even small changes in the rate of absorption of the getter significantly alters the proportion of gasses absorbed by the getter relative to cathode layer. Given this result, by decreasing the rate at which the cathode layer absorbs the reactive gasses (this rate is decreased by using the diffusion layer 124), the proportion of reactive gasses absorbed by the getter 127 relative to the cathode layer can be increased, thus increasing the lifetime of the OLED display 121.

Figure 2:
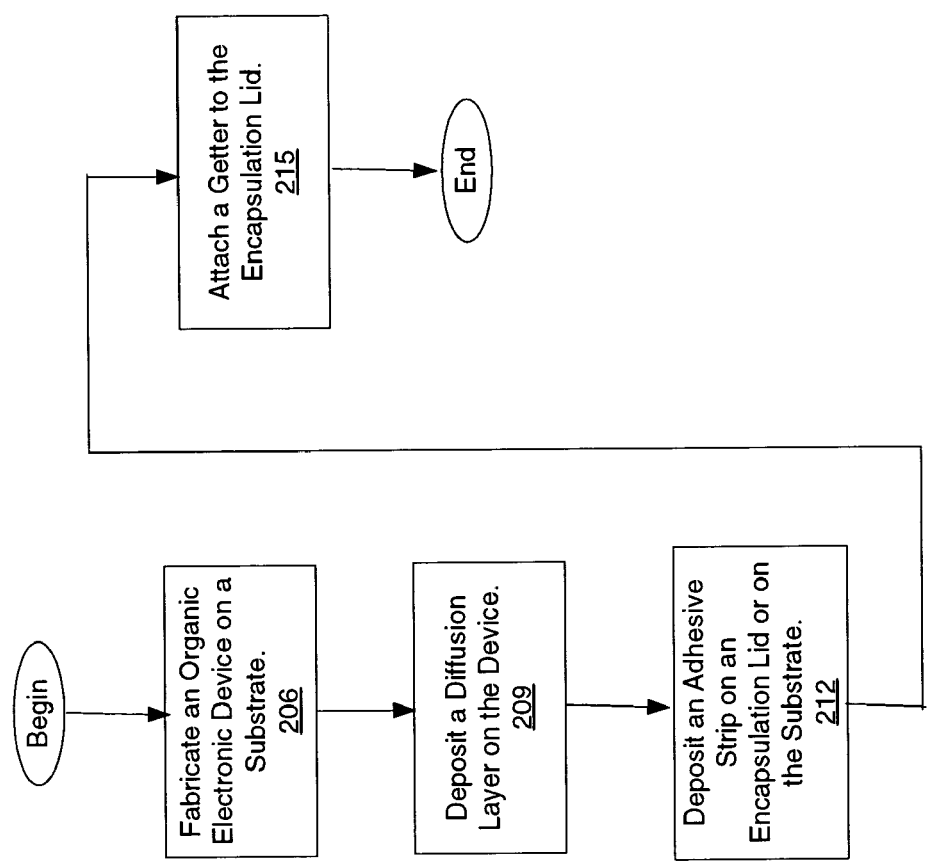
FIG. 2 shows a flowchart of an embodiment of a process to encapsulate the organic optoelectronic device according to the present invention.

FIG. 2 shows a flowchart of an embodiment of a process to encapsulate the OLED display 121 according to the present invention. In block 206, the OLED display 121 is fabricated on the substrate 112. The OLED display 121 can include a cathode layer that is patterned to form cathode strips. In block 209, the diffusion layer 124 is deposited on the OLED display 121. The diffusion layer 124 is deposited so as to cover exposed areas of the OLED display. The exposed areas that are covered include the top and sides of the device including the top and sides of the cathode strips. In block 212, the adhesive layer 115 is deposited on the encapsulation lid 118, or alternatively, the adhesive layer 115 is deposited on the substrate 112 around a perimeter of the diffusion layer 124. The adhesive layer 115 bonds to both the encapsulation lid 120 and the substrate 112, and is deposited such that when the adhesive layer 115, the encapsulation lid 118, and the substrate 112 are brought together, the OLED display 121 is sealed. In block 215, the getter 127 is attached to the encapsulation lid 118 such that when the adhesive layer 115, the encapsulation lid 118, and the substrate 112 are brought together, the getter 127 overlies the OLED display 121. Then, to form the encapsulated device package, the encapsulation lid 118 and the substrate 112 are brought together such that the adhesive layer 115 bonds with both the encapsulation lid 118 and the substrate 112 so as to seal the OLED display 121. The diffusion layer 124 slows the rate of absorption of the reactive gasses 130 by the cathode, and also increases the proportion of the reactive gasses 130 absorbed by the getter 127 relative to the cathode.

The following example is presented for a further understanding of the invention and should not be construed as limiting the scope of the appended claims or their equivalents.

EXAMPLE

Two groups of OLED displays were fabricated. The displays were encapsulated using encapsulation lids and attached to the encapsulation lids are typical OLED getters. In this example, a diffusion layer was not deposited on any of the OLED displays; however, the getters that were attached to the encapsulation lids employed a semi-permeable membrane that held in place the getter materials, and these OLED getters were above the OLED displays. The difference between the two groups of devices is that the groups used different semi-permeable membranes. The shape and size of the pores of the semi-permeable membranes (i.e., diffusion layers) was different in one group than those of the other group. The semi-permeable membranes of group 2 (in FIG. 3, this group is designated by "□-□-□") allowed the getters in that group to have a faster rate of absorption than the getters in group 1 (in FIG. 3, this group is designated by "Δ-Δ-Δ").

The encapsulated device package is a dynamic system that includes a leak (the leak refers to the reactive gasses permeating through the adhesive seal) and two scavengers (the two scavengers are the getter and the cathode). The relative quantity of the reactive gases that are captured by each scavenger can be determined by the sorption rates. The dynamics and capacity of this type of system can be evaluated in temperature humidity tests where the leak and one of the scavenging systems (the cathode) are held constant, while the other scavenging system (the getter) is varied.

Figure 3:
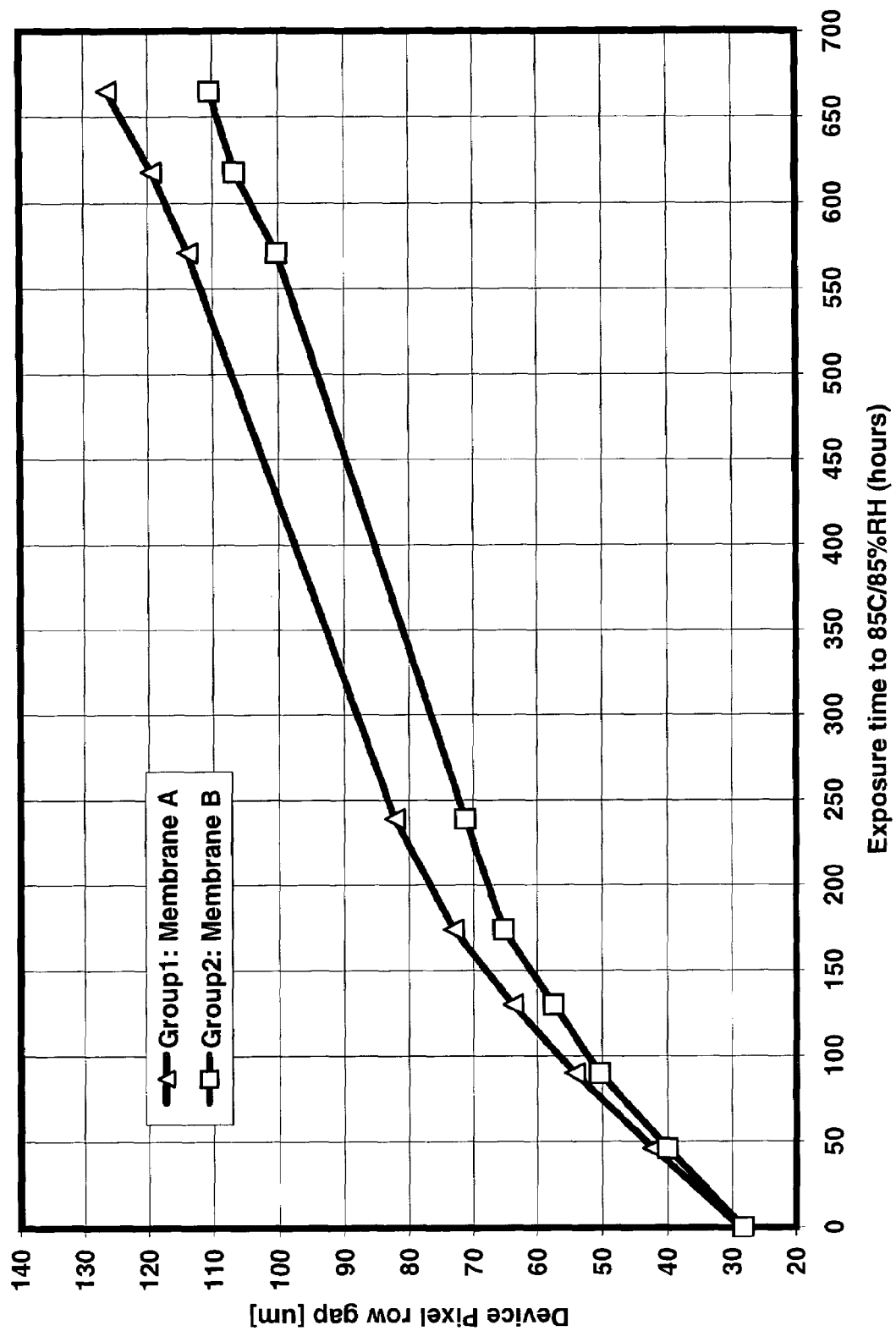
FIG. 3 shows the graph of the pixel row gap versus exposure time for two different groups of OLED displays with each group having different getter semi-permeable membranes.

FIG. 3 shows the graph of the pixel row gap versus exposure time for two different groups of OLED displays with each group having different getter semi-permeable membranes. By monitoring the amount of cathode area that has reacted (this amount reacted is quantified by the pixel row gap), the relative amount of reactive gasses that has been absorbed by the cathode compared to that of the getter can be determined. From the relative performance of the two different groups shown in FIG. 3, two primary observations can be made. The first observation is that well beyond the useful life of the device (for example, the device can be considered no longer useful if the pixel row gap is 80 micrometers or greater), the relative cathode/getter absorption rates do not change dramatically. This indicates that for all the getters employed, none of the getters are reaching their capacity limit. In this case, the getter performance can be entirely described by the absorption rate alone. The next observation is the difference between the absorption rates of group 1 versus group 2. The getters in the two groups employ the same absorbing material in the same quantity, but differ in the semi-permeable membrane that is used to contain the absorbing material. This illustrates that even small changes in a semi-permeable membrane can significantly alter the quantity of reactive gas that is captured by the getter relative to that of the cathode. The sensitivity of the dynamics of the total system to a small change in the semi-permeable membrane is surprising. As shown here, by decreasing the rate at which the getter absorbs the reactive gasses, the proportion of reactive gasses absorbed by the cathode layer is increased. Extrapolating these observations, the proportion of reactive gasses absorbed by the getter 127 relative to the cathode layer can be increased by adding the diffusion layer 124.

While an embodiments of the encapsulated device package is illustrated in which an OLED display is encapsulated, almost any type of organic optoelectronic device can be encapsulated. In particular, the diffusion layer can be deposited on an organic light sensor array, an organic solar cell array, or an organic laser to increase the proportion of reactive gasses absorbed by the getter. The encapsulated OLED display package described earlier can be used within displays in applications such as, for example, computer displays, information displays in vehicles, television monitors, telephones, printers, and illuminated signs.

As any person of ordinary skill in the art of organic optoelectronic device fabrication will recognize from the description, figures, and examples that modifications and changes can be made to the embodiments of the invention without departing from the scope of the invention defined by the following claims.

What is claimed:

1. An encapsulated organic optoelectronic device, comprising:
    a substrate;
    an organic optoelectronic device on said substrate, said organic optoelectronic device includes a cathode;
    a diffusion layer on said organic optoelectronic device, said diffusion layer covers exposed areas of said organic optoelectronic device;
    an adhesive layer on said substrate and around a perimeter of said diffusion layer, wherein said adhesive layer is separated from said diffusion layer by a gap such that said adhesive layer does not physically contact said diffusion layer;
    an encapsulation lid on said adhesive layer, said encapsulation lid forming a cavity around said organic optoelectronic device such that there is a gap between said encapsulation lid and said diffusion layer; and
    a getter on said encapsulation lid, said getter overlies said organic optoelectronic device,
    wherein said diffusion layer slows a rate of absorption of reactive gasses by said cathode and increases a proportion of said reactive gasses absorbed by said getter relative to said cathode.

2. The encapsulated organic optoelectronic device of claim 1 wherein said diffusion layer is a solvent-free organic polymer layer.

3. The encapsulated organic optoelectronic device of claim 1 wherein said diffusion layer is a solvent-free UV-curable acrylate material.

4. The encapsulated organic optoelectronic device of claim 1, wherein said diffusion layer is a UV-curable or thermally-curable solvent-free epoxy.

5. The encapsulated organic optoelectronic device of claim 1 wherein said diffusion layer is a solvent-free photoresist.

6. The encapsulated organic optoelectronic device of claim 1 wherein said reactive gasses are oxygen and moisture.

7. The encapsulated organic optoelectronic device of claim 1 wherein said getter has a relatively slow rate of absorption compared to a rate of absorption of said cathode.

8. The encapsulated organic optoelectronic device of claim 1 wherein said organic optoelectronic device is any one of:
   an OLED display, an organic light sensor array, an organic solar cell array, or an organic laser.

9. The encapsulated organic optoelectronic device of claim 1, wherein said diffusion layer does not physically contact said getter.

10. An encapsulated organic optoelectronic device, comprising:
   a substrate;
   an organic optoelectronic device on said substrate, said organic optoelectronic device including a cathode;
   a diffusion layer on said organic optoelectronic device, said diffusion layer covering exposed areas of said organic optoelectronic device;
   an adhesive layer on said substrate and around a perimeter of said diffusion layer;
   an encapsulation lid on said adhesive layer; and
   a getter on said encapsulation lid, wherein said getter overlies said organic optoelectronic device, said getter is spaced from said diffusion layer by a gap, and said encapsulation lid with said getter forms a cavity around said organic optoelectronic device.

* * * * *